(12) United States Patent
Rampley et al.

(10) Patent No.: US 10,998,231 B2
(45) Date of Patent: May 4, 2021

(54) METHOD FOR INCREASING SEMICONDUCTOR DEVICE WAFER STRENGTH (71) Applicant: NXP USA, Inc., Austin, TX (US)

(72) Inventors: Colby Greg Rampley, Phoenix, AZ (US); Alan J. Magnus, Gilbert, AZ (US); Jason R. Wright, Chandler, AZ (US); Jeffrey Lynn Weibrecht, Gilbert, AZ (US); Elijah Blue Foster, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 202 days.

(21) Appl. No.: 16/440,675

(22) Filed: Jun. 13, 2019

(65) Prior Publication Data
US 2020/0395247 A1 Dec. 17, 2020

(51) Int. Cl.
H01L 21/78 (2006.01)
H01L 23/58 (2006.01)
H01L 21/683 (2006.01)
H01L 23/00 (2006.01)

(52) U.S. Cl.
CPC .......... H01L 21/78 (2013.01); H01L 21/6836 (2013.01); H01L 23/585 (2013.01); H01L 24/29 (2013.01); H01L 24/83 (2013.01); H01L 2221/68327 (2013.01); H01L 2224/2957 (2013.01); H01L 2224/8384 (2013.01)

(58) Field of Classification Search
CPC ... H01L 21/6836; H01L 23/585; H01L 24/83; H01L 24/29; H01L 21/6835; H01L 21/78; H01L 2221/6834; H01L 2224/8384; H01L 2224/2957; H01L 2221/68327
See application file for complete search history.

(56) References Cited

U.S. PATENT DOCUMENTS

| 7,679,200 | B2 | 3/2010 | Su et al. | |
| 7,927,916 | B2* | 4/2011 | Lake | H01L 27/14618 438/106 |
| 9,379,065 | B2 | 6/2016 | Keser et al. | |
| 9,679,855 | B1 | 6/2017 | Lee et al. | |
| 2008/0124838 | A1* | 5/2008 | Liu | H01L 24/33 438/113 |

(Continued)

FOREIGN PATENT DOCUMENTS

JP 2018147990 A 9/2018

Primary Examiner — Savitri Mulpuri
(74) Attorney, Agent, or Firm — Charlene R. Jacobsen (57) ABSTRACT A device wafer is provided that includes a substrate having major and minor surfaces, and a plurality of active devices located at the major surface. A eutectic alloy composition is formed at the minor surface of the substrate. The eutectic alloy composition is removed from the minor surface of the substrate such that a portion of the eutectic alloy composition remains at an outer perimeter of the minor surface to strengthen the outer perimeter of the substrate. A bonding layer is deposited over the minor surface and over the portion of the eutectic alloy composition at the outer perimeter of the minor surface. The bonding layer is utilized for joining semiconductor components of the device wafer to secondary structures. Additional eutectic alloy composition may remain on the minor surface of the substrate at the streets to strengthen the substrate during device wafer separation.

16 Claims, 7 Drawing Sheets

(56) References Cited

U.S. PATENT DOCUMENTS

| | | | |
|---|---|---|---|
| 2010/0207237 A1 | 8/2010 | Yao et al. | |
| 2012/0286429 A1* | 11/2012 | Han | H01L 24/94 257/774 |
| 2013/0037966 A1* | 2/2013 | Qiu | H01L 21/78 257/782 |
| 2014/0091454 A1* | 4/2014 | Lin | H01L 23/3121 257/734 |
| 2015/0001708 A1* | 1/2015 | Lin | H01L 23/5389 257/737 |
| 2021/0036169 A1* | 2/2021 | Rampley | H01L 33/0095 |

\* cited by examiner

FIG. 1

PRIOR ART

METHOD FOR INCREASING SEMICONDUCTOR DEVICE WAFER STRENGTH

TECHNICAL FIELD OF THE INVENTION

The present invention relates generally to semiconductor processing. More specifically, the present invention relates to methods for increasing the strength of semiconductor device wafers.

BACKGROUND OF THE INVENTION

In the fabrication of semiconductor devices, a large number of semiconductor devices is typically fabricated on a single silicon wafer. Device function may be implemented in the silicon wafer through process steps of diffusion, oxidation, and the like. Subsequent process operations may entail wafer thinning at the back side (e.g., the non-device side) of the wafer and separating the wafer into a plurality of individual devices. Each of the devices can be mounted in a package for protection, heat sinking, electrical connection, and so forth.

SUMMARY

Aspects of the disclosure are defined in the accompanying claims.

In a first aspect, there is provided a method comprising providing a device wafer, the device wafer including a substrate having a major surface and a minor surface opposite the major surface, and a plurality of active devices located at the major surface; forming a eutectic alloy composition at the minor surface of the substrate; removing the eutectic alloy composition from the minor surface of the substrate such that a portion of the eutectic alloy composition remains at an outer perimeter of the minor surface; and depositing a bonding layer over the minor surface and the portion of the eutectic alloy composition at the outer perimeter of the minor surface.

In a second aspect, there is provided a method of attaching a semiconductor component to a secondary structure comprising providing a device wafer, the device wafer including a substrate having a major surface and a minor surface opposite the major surface, a plurality of semiconductor die areas at the major surface, a plurality of active devices located at the plurality of semiconductor die areas, and streets around peripheries of the semiconductor die areas; forming a eutectic alloy composition on the minor surface of the substrate; removing the eutectic alloy composition from the minor surface of the substrate such that a portion of the eutectic alloy composition remains at an outer perimeter of the minor surface; depositing a bonding layer over the minor surface and the portion of the eutectic alloy composition at the outer perimeter of the minor surface; separating the plurality of the semiconductor die areas at the streets to produce a plurality of semiconductor components each having the bonding layer, the semiconductor component being one of the plurality of semiconductor components; and utilizing the bonding layer to attach the semiconductor component to the secondary structure.

In a third aspect, there is provided a method comprising providing a device wafer, the device wafer including a silicon substrate having a major surface and a minor surface opposite the major surface, a plurality of semiconductor die areas at the major surface, a plurality of active devices located at the plurality of semiconductor die areas, and streets around peripheries of the semiconductor die areas; applying a eutectic forming material layer on the minor surface of the substrate; alloying the eutectic forming material layer into the silicon substrate to generate a eutectic alloy composition; removing the eutectic alloy composition from the minor surface of the substrate such that a portion of the eutectic alloy composition remains at an outer perimeter of the minor surface and an additional portion of the eutectic alloy composition remains at the streets; and depositing a bonding layer over the minor surface, over the portion of the eutectic alloy composition at the outer perimeter of the minor surface, and over the additional portion of the eutectic alloy composition remaining at the streets.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

In overview, the present disclosure concerns a semiconductor device wafer, semiconductor components, and methodology for manufacturing a device wafer and for attaching semiconductor components of the device wafer to secondary structures. More particularly, methodology entails forming a eutectic alloy composition at the back surface of a thinned device wafer such that a portion of the eutectic alloy composition remains at the outer perimeter of the device wafer. The methodology further entails depositing a bonding layer over the back surface and over the remaining portion of the eutectic alloy composition. In some embodiments, the eutectic alloy composition may be patterned such that an additional portion of the eutectic alloy composition remains at the saw streets of the back surface of the device wafer. Eutectic alloy composition formation and patterning may be integrated into a process flow to inhibit crack generation and propagation at the device wafer edges and along saw streets during device wafer dicing, and the bonding layer may be utilized for joining individual semiconductor components of the device wafer to secondary structures. Such an approach may cost effectively reduce wafer breakage due to crack generation and propagation by increasing the strength of the wafer device at strategic locations.

The instant disclosure is provided to further explain in an enabling fashion at least one embodiment in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish different elements that may be produced utilizing current and upcoming fabrication techniques of depositing, patterning, etching, and so forth.

As used herein, the term "semiconductor" is intended to include any semiconductor whether single crystal, polycrystalline or amorphous and to include type IV semiconductors, non-type IV semiconductors, compound semiconductors as well as organic and inorganic semiconductors. Further, the terms "substrate" and "semiconductor substrate" are intended to include single crystal structures, polycrystalline structures, amorphous structures, thin film structures, layered structures, bulk or semiconductor-on-insulator (SOI) structures. For convenience of explanation and not intended to be limiting, semiconductor devices and methods of fabrication are described herein for silicon semiconductors, but persons of skill in the art will understand that other semiconductor materials may also be used.

Figure 1:
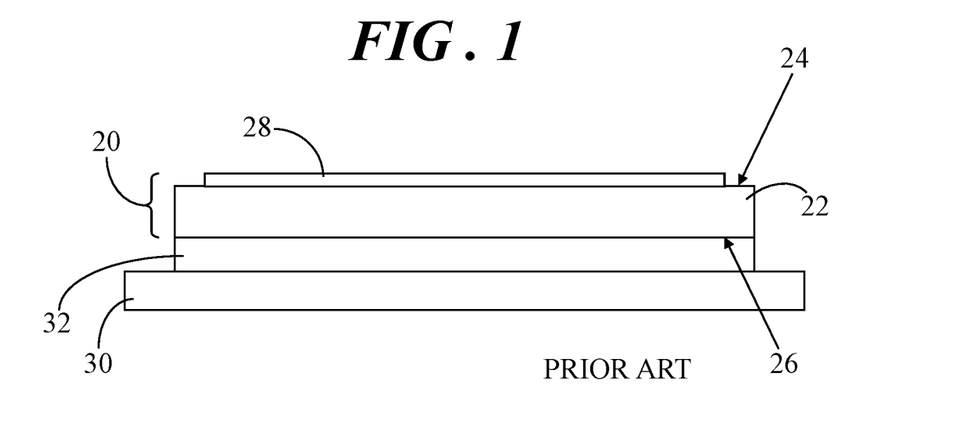
FIG. 1 shows a side view of a portion of a prior art device wafer.

Referring to FIG. 1, FIG. 1 shows a side view of a portion of a prior art semiconductor component 20. Semiconductor component 20 includes a silicon substrate 22 having a major surface 24 and a minor surface 26 opposite major surface 24. The term "major surface" refers to the side of substrate 22 at which active devices 28 of semiconductor component 20 are located. The term "minor surface" refers to the back side, or inactive side, of substrate 22. Semiconductor component 20 is bonded to a secondary structure 30 via a bonding layer 32. Active devices 28 that make up semiconductor component 20 may be any of a myriad of different types of circuit devices used in electronics such as, for example, transistors, microprocessors, graphics processors, application specific integrated circuits, memory devices, and the like. Secondary structure 30 may be metal or a metallized structure, such as a leadframe, heat sink, printed circuit board, and the like. Bonding layer 32 may be solder, an adhesive epoxy, or another suitable material for attaching semiconductor component 20 to secondary structure 30.

In one technique, semiconductor component 20 is attached using a silver sinter die attach process. In this technique, minor surface 26 of silicon substrate 22 is coated with gold and the silver sinter forms a bond between the gold coated silicon substrate 22 and secondary structure 30. The implementation of a silver sinter bonding process with a gold coated silicon substrate can be problematic. For example, if the silicon of substrate 22 diffuses completely through the gold layer so that silicon atoms are exposed at the surface of the gold bonding layer 32, these silicon atoms can subsequently be oxidized, whether by heating during a subsequent assembly step or just by exposure to room ambient conditions. The formation of oxidized silicon at the gold surface can act as a barrier to the complete wetting of the surface during attachment to secondary structure 30. This results in the formation of voids in the die bond which can severely impact the reliability of the die bond In another technique, semiconductor component 20 is attached using a solderable backmetal as a bonding layer for bonding layer 32. A solderable backmetal may entail multiple material layers such as, for example, titanium/nickel-vanadium/silver/gold (Ti/NiV/Ag/Au), titanium-tungsten/nickel-vanadium/titanium-tungsten/gold (TiW/NiV/TiW/Au), gold/titanium-tungsten/gold (Au/TiW/Au), and the like. Such solderable die attach techniques and materials may yield stronger die bonds than the gold/silicon eutectic bonding method. However, solderable die attach techniques produce higher wafer breakage than eutectic bonding due to wafer cracking, thereby adversely affecting semiconductor component yield.

Embodiments described herein include process operations that can inhibit crack generation and propagation at the device wafer edges and, in some embodiments, along saw streets during device wafer dicing to cost effectively reduce wafer breakage due to crack generation and propagation by increasing the strength of the wafer device at strategic locations.

Figure 2:
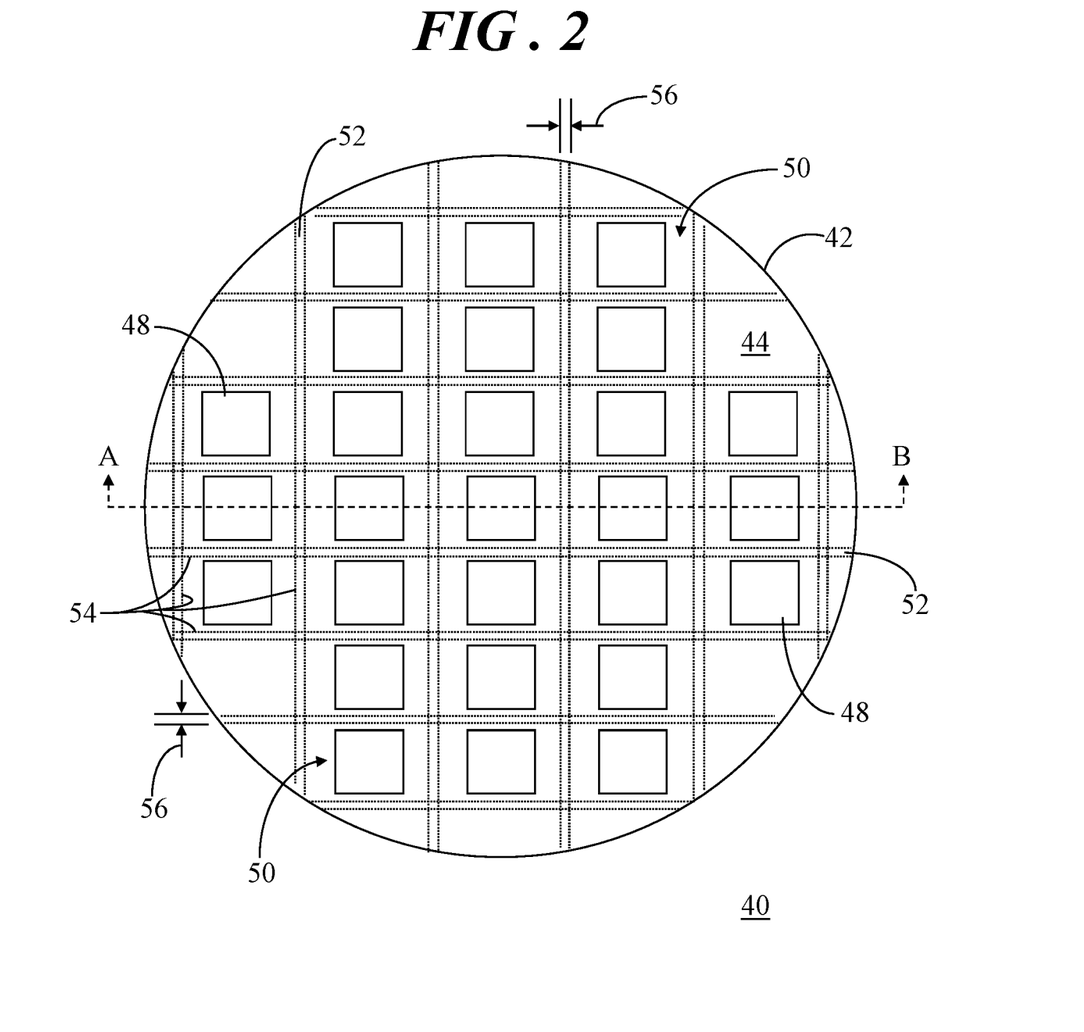
FIG. 2 shows a plan view of a device wafer.
Figure 3:
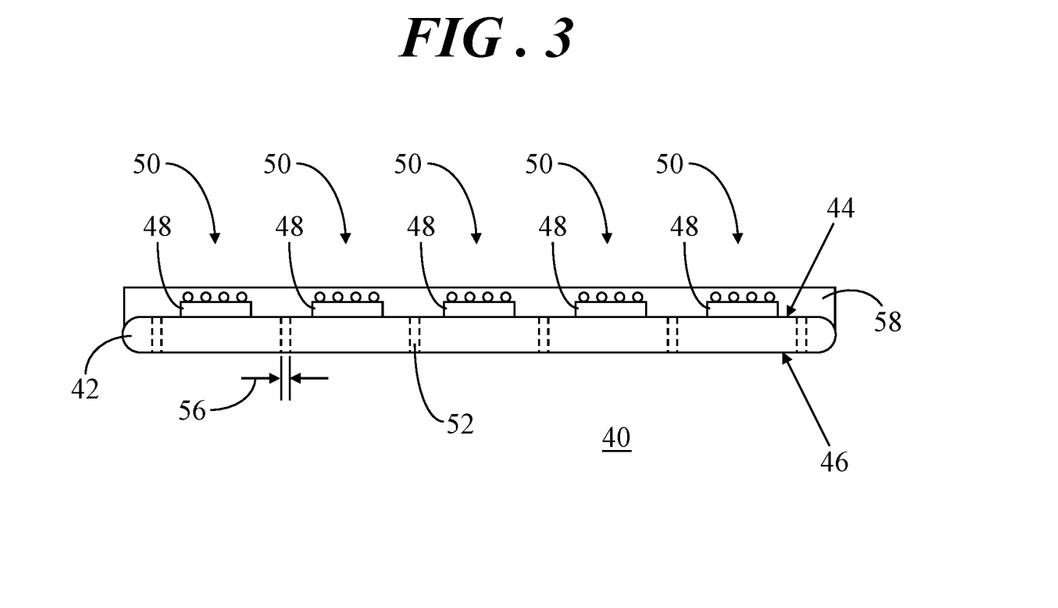
FIG. 3 shows a cross-sectional view of the device wafer along section lines A-B in FIG. 2 at an initial stage of processing.

Referring to FIGS. 2-3, FIG. 2 shows a plan view of a device wafer 40 and FIG. 3 shows a cross-sectional view of device wafer 40 along section lines A-B in FIG. 2 at an initial stage of processing. At the initial stage of processing, a device wafer 40 is provided that includes a substrate 42 having a major surface 44 and a minor surface 46 opposite major surface 44. Again, the term "major surface" refers to the side of substrate 42 at which active devices 48 are located and the term "minor surface" refers to the back side, or inactive side, of substrate 42. Substrate 42 may be a silicon substrate and active devices 48, generally represented by boxes, may be any of a myriad of different types of circuit devices used in electronics such as, for example, transistors, microprocessors, graphics processors, application specific integrated circuits, memory devices, and the like. In alternate embodiments, substrate 42 can include any semiconductor material or combinations of materials, such as gallium arsenide, silicon germanium, silicon, monocrystalline silicon, the like, and combinations of the above.

Device wafer 40 includes a plurality of semiconductor die areas 50 at which active devices 48 are located. Streets 52 are located between semiconductor die areas 50 around peripheries 54 of each of semiconductor die areas. Streets 52 (also referred to as saw streets, kerf, dicing lines) represent the areas between adjacent semiconductor die areas 50. In this example illustration, each of streets 52 is represented by a pair of dashed lines thereby indicating that streets 52 are characterized by a width 56. Width 56 represents an amount of material loss (e.g., width of a saw cut) that may occur when device wafer 40 is diced, cut, or otherwise separated along streets 52. Accordingly, active devices 48 are not present in, or very near to, streets 52. Major surface 44 of device wafer 40, along with active devices 48, may be laminated or otherwise encapsulated in, for example, a UV-curable back-grinding tape 58, which ensures against damage to major surface 44 and/or active devices 48 during subsequent processes (discussed below) and prevents wafer surface contamination caused by infiltration of grinding fluid and/or debris.

Figure 4:
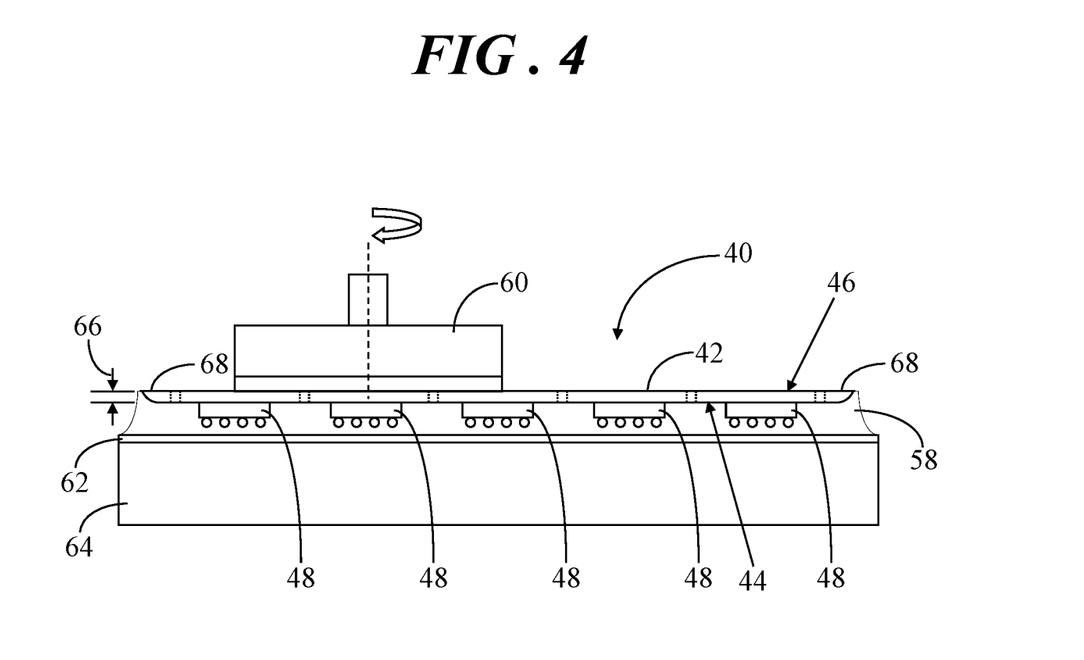
FIG. 4 shows a cross-sectional view of the device wafer of FIG. 3 at a subsequent stage of processing.

FIG. 4 shows a cross-sectional view of device wafer 40 of FIG. 3 at a subsequent stage of processing. At this stage of processing, device wafer 40 undergoes wafer thinning at minor surface 46 of substrate 42. Wafer thinning, also referred as wafer backgrinding, is a semiconductor device fabrication process during which the substrate thickness is reduced using, for example, a rotating or oscillating backgrinding tool 60. For example, a temporary adhesive 62 may be used to attach device wafer 40 to a carrier structure 64 with minor surface 46 of substrate 42 facing backgrinding tool 60. Substrate 42 may be reduced to a thickness 66 that is 10% or less than the original thickness of substrate 42. Wafer thinning processes enable stacking and high-density packaging of integrated circuits.

Wafer thinning typically yields a non-uniform thickness of device wafer 40 at an outer perimeter 68 of device wafer 40. More particularly, thickness 66 of the thinned substrate 42 reduces or tapers to approximately zero at outer perimeter 68. This reduction in the thickness of substrate 42 weakens outer perimeter 68 of device wafer 40 relative to a remaining portion of device wafer 40. The reduction in thickness of device wafer 40 at outer perimeter 68 is a common source of atomic level crack generation and propagation of cracks in device wafer 40.

Figure 5:
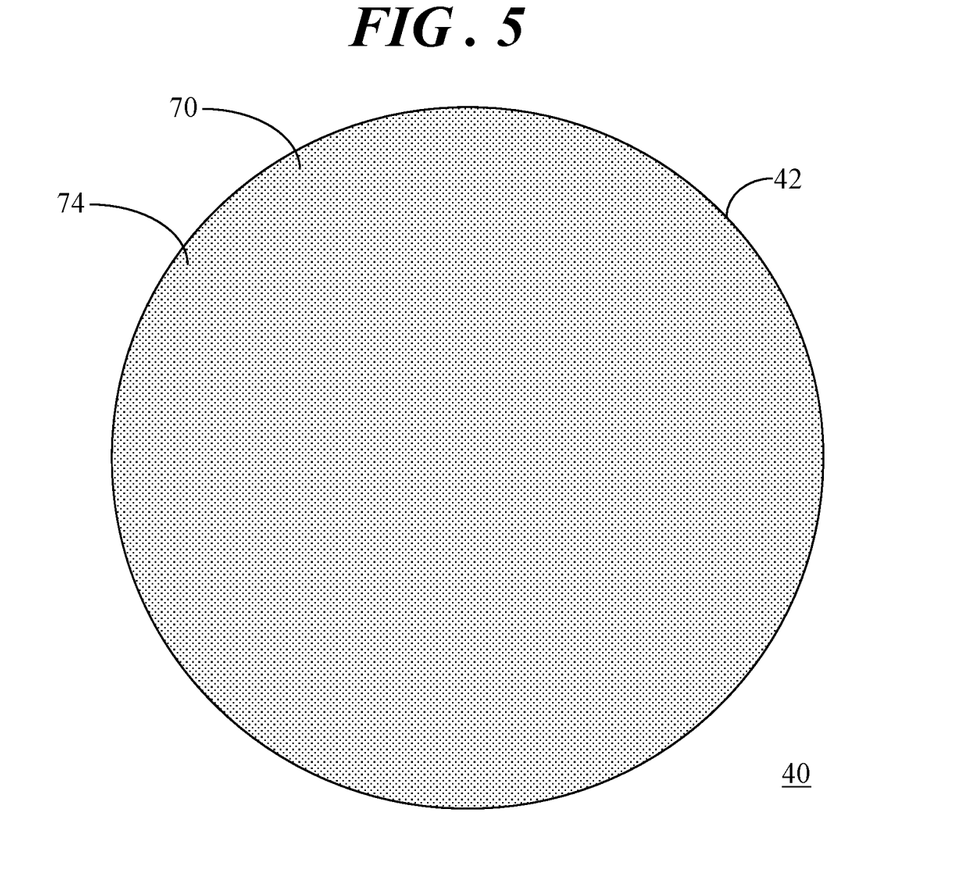
FIG. 5 shows a plan view of the device wafer of FIG. 4 at a subsequent stage of processing.
Figure 6:
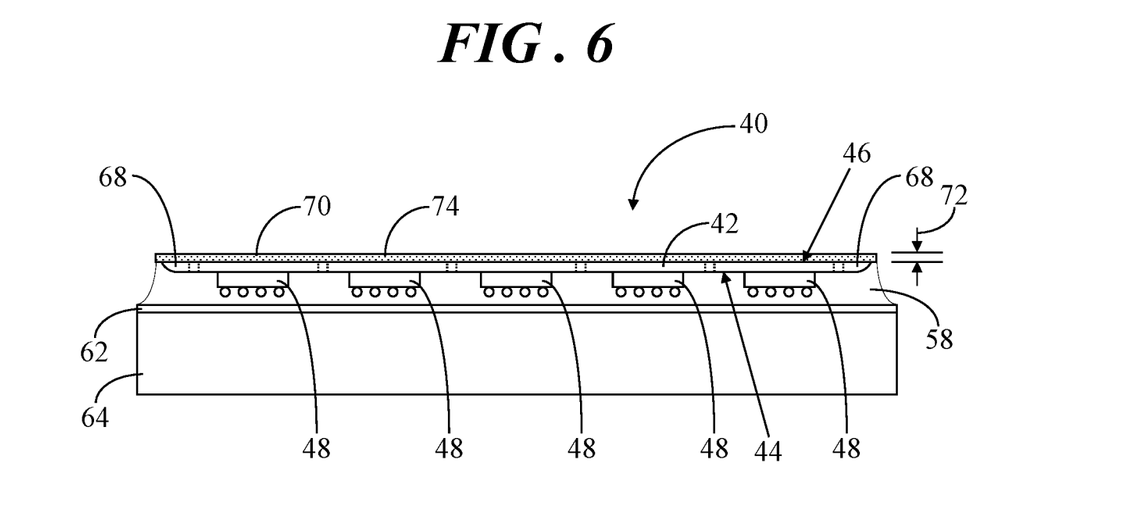
FIG. 6 shows a cross-sectional view of the device wafer of FIG. 5.

Referring to FIGS. 5-6, FIG. 5 shows a plan view of device wafer 40 of FIG. 4 at a subsequent stage of processing and FIG. 6 shows a cross-sectional view of device wafer 40. In accordance with an embodiment, methodology entails applying or depositing a eutectic forming material layer 70 on minor surface 46 of substrate 42. In FIGS. 5-6, as well as subsequent FIGS. 7-12, carrier structure 64, temporary adhesive 62, and back-grinding tape 58 are shown for simplicity. However, it should be understood that during semiconductor wafer processing operations, carrier structure 64, temporary adhesive 62, and back-grinding tape 58 may be replaced by other suitable handlers and adhesives.

In an example, eutectic forming material layer 70 may be pure gold or gold alloyed with small amounts (typically 1-2% or less) of other materials such as germanium, chromium, or the like. Eutectic forming material layer 70 may be deposited to a depth 72 in a range of 2.5-7.5 kilo Angstroms (kA). In some embodiments, depth 72 may be 5kA. Device wafer 40 may then be heated to a temperature in a range of, for example, 330°-360° C. to alloy layer 70 into silicon substrate 42 to form a eutectic alloy composition 74. In this example in which substrate 42 is silicon and eutectic forming material layer 70 is gold, the resulting eutectic alloy composition 74 is a silicon-gold eutectic layer.

During the process of alloying the gold eutectic forming material layer 70 on minor surface 46 of silicon substrate 42, silicon diffuses from substrate 42 into gold eutectic forming material layer 70 and gold from eutectic forming material layer 70 diffuses into silicon substrate 42. Good adhesion at the silicon-gold interface occurs when enough silicon diffuses across the interface into the gold and enough gold diffuses across the silicon-gold interface to form a strong chemical bond. Additionally, diffusion of the gold eutectic forming material layer 70 into silicon substrate 42 may fill the atomic level cracks in the thinned substrate 42 to reduce wafer breakage. Depth 72 is determined to achieve an optimum diffusion of silicon into the gold and gold into the silicon to form eutectic alloy composition 74, e.g., the silicon-gold eutectic layer.

Figure 7:
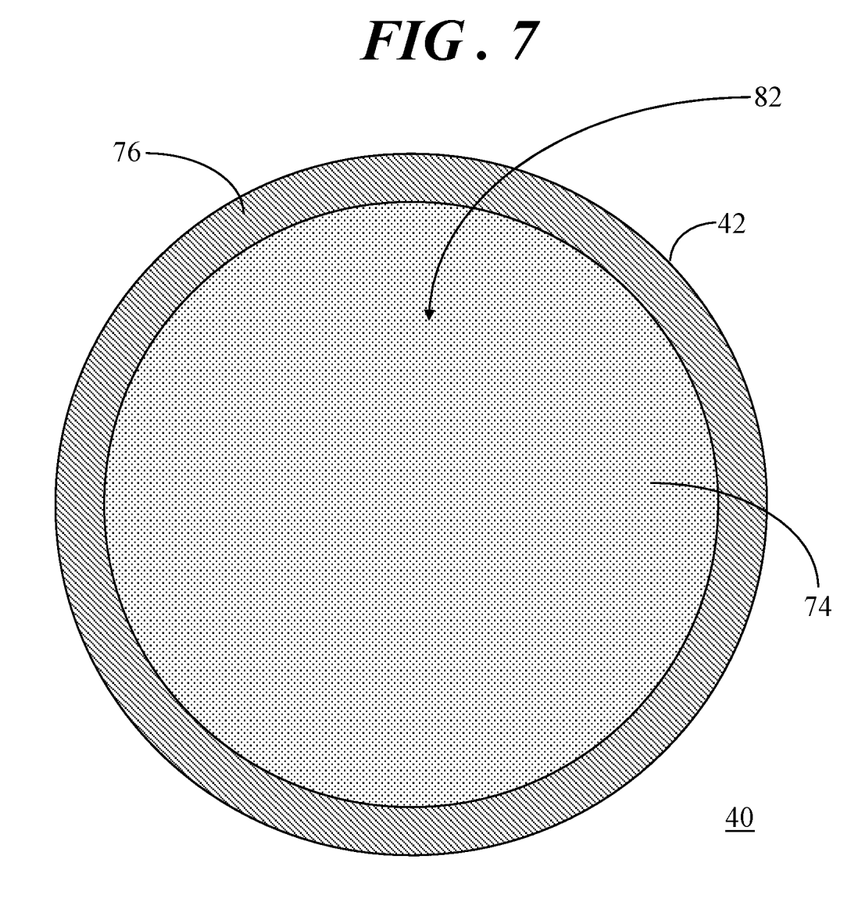
FIG. 7 shows a plan view of the device wafer of FIGS. 5-6 at a subsequent stage of processing.
Figure 8:
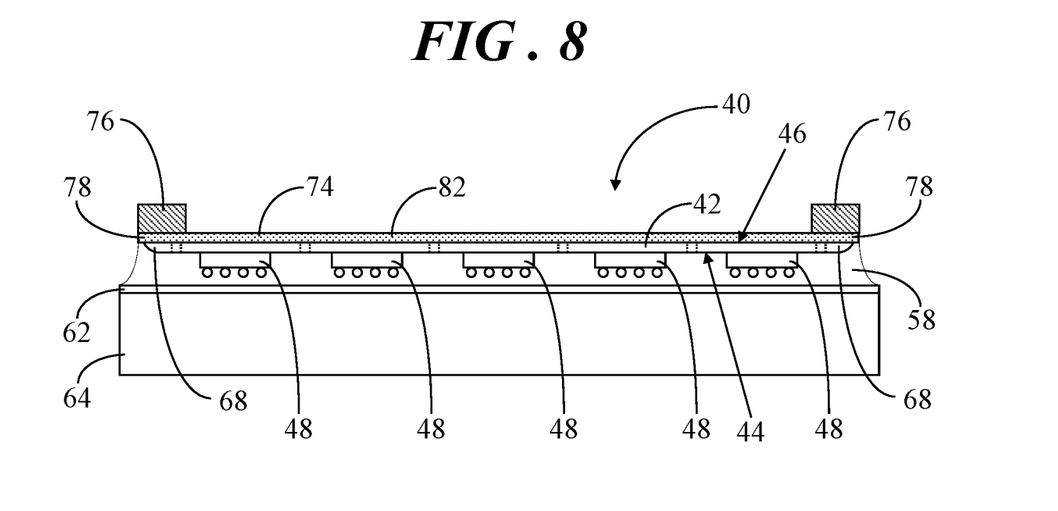
FIG. 8 shows a cross-sectional view of the device wafer of FIG. 7.

Referring to FIGS. 7-8, FIG. 7 shows a plan view of the device wafer 40 of FIGS. 5-6 at a subsequent stage of processing and FIG. 8 shows a cross-sectional view of device wafer 40. In accordance with some embodiments, methodology further entails selectively removing silicon-gold eutectic alloy composition 74 from minor surface 46 of substrate 42 such that a portion of silicon-gold eutectic alloy composition 74 remains at outer perimeter 68 of minor surface 46. By way of example, the removing process entails forming a patterned photoresist 76 over silicon-gold eutectic alloy composition 74 to define a central opening and cover a portion 78 of eutectic alloy composition 74 at outer perimeter 68 of substrate 42 of device wafer 40. Thus, an unmasked portion 82 of eutectic alloy composition 74 is exposed from patterned photoresist 76 at the central opening.

Figure 9:
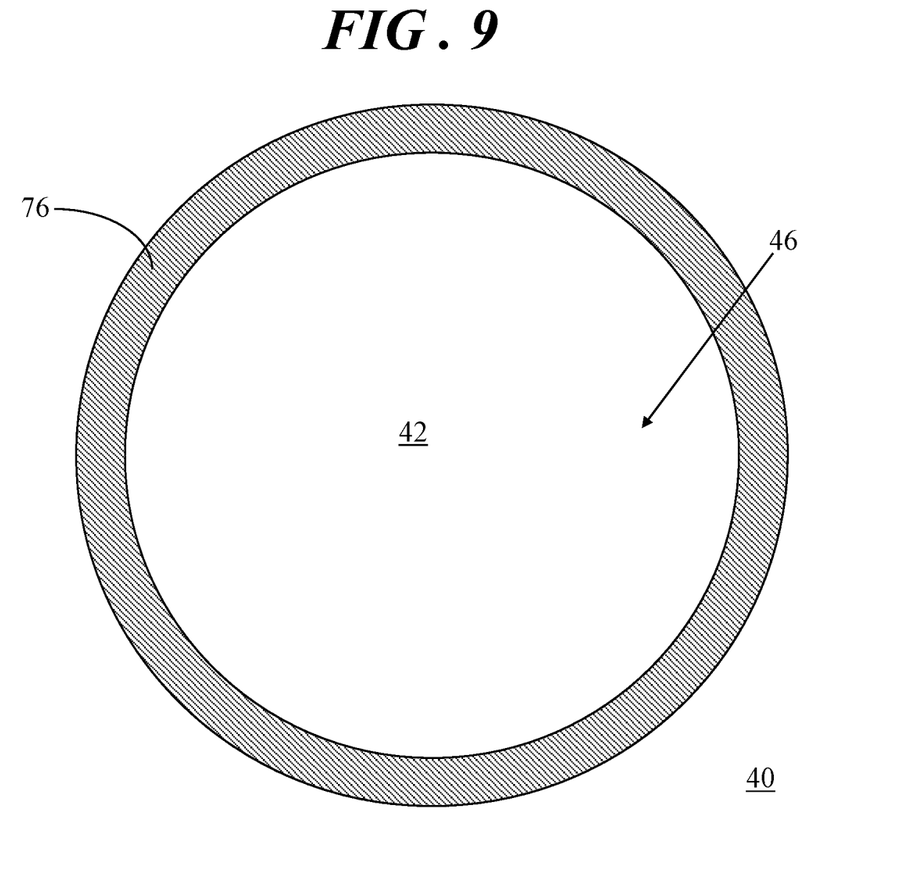
FIG. 9 shows a plan view of the device wafer of FIGS. 7-8 at a subsequent stage of processing.
Figure 10:
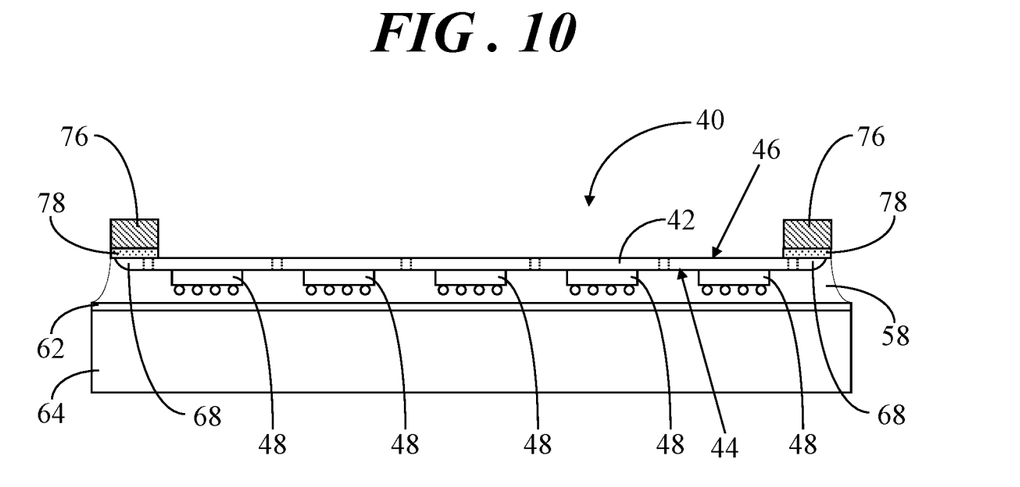
FIG. 10 shows a cross-sectional view of the device wafer of FIG. 9.

Referring to FIGS. 9-10, FIG. 9 shows a plan view of device wafer 40 of FIGS. 7-8 at a subsequent stage of processing and FIG. 10 shows a cross-sectional view of device wafer 40. Following formation of mask 76, unmasked portion 82 (shown in FIGS. 7-8) of eutectic alloy composition 74 is removed from minor surface 46 of substrate 42. For example, unmasked portion 82 of eutectic alloy composition 74 may be etched back to minor surface 46 of substrate 24 using any suitable wet or dry etch process.

Figure 11:
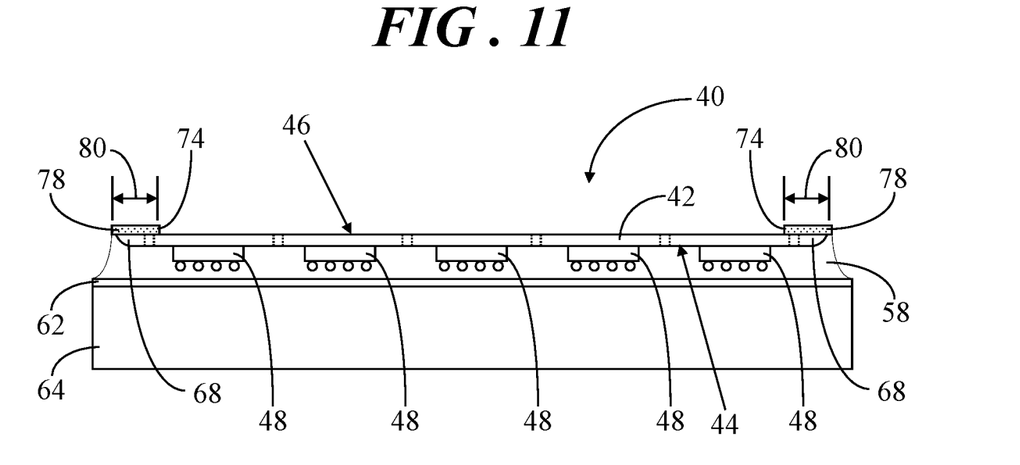
FIG. 11 shows a cross-sectional view of the device wafer of FIGS. 9-10 at a subsequent stage of processing.

FIG. 11 shows a cross-sectional view of the device wafer of FIGS. 9-10 at a subsequent stage of processing in which mask 76 (FIG. 10) has been removed following removal of unmasked portion 82 (FIG. 10) of eutectic alloy composition 74 such that portion 78 of eutectic alloy composition 74 remains on minor surface at outer perimeter 68 of substrate 42. In some embodiments, a width 80 of portion 78 of eutectic alloy composition 74 parallel to minor surface 46 of substrate 42 is approximately 2.5 mm to effectively strengthen the thinned substrate 42 at outer perimeter 68 to withstand crack generation and propagation during further wafer handling.

Figure 12:
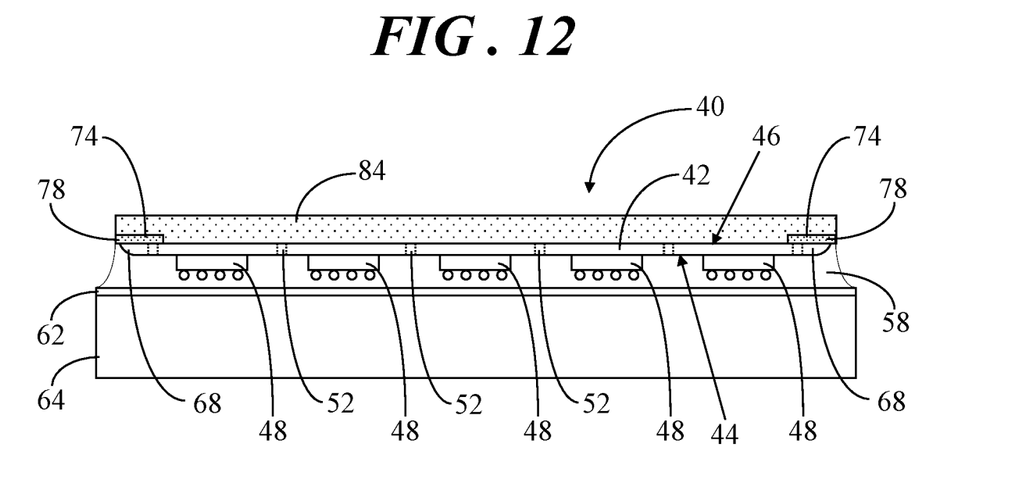
FIG. 12 shows a cross-sectional view of the device wafer of FIG. 11 at a subsequent stage of processing.

FIG. 12 shows a cross-sectional view of device wafer 40 of FIG. 11 at a subsequent stage of processing in which a bonding layer 84 is deposited over minor surface 46 of substrate 42 and over the remaining portion 78 of eutectic alloy composition 74 at outer perimeter 68 of minor surface 46. In some embodiments, bonding layer 84 may be a solderable backmetal such as any of the previously mentioned layered solderable backmetal materials. In alternative embodiments, bonding layer 84 may be an adhesive epoxy or another suitable material. A top surface of bonding layer 84 is shown as being substantially planar for simplicity of illustration. However, it should be understood that bonding layer 84 overlying portion 78 of eutectic alloy composition 74 may extend higher than the remaining bonding layer 84 deposited directly on minor surface due to the presence of portion 78 of eutectic alloy composition at perimeter 68 of substrate 42.

Figure 13:
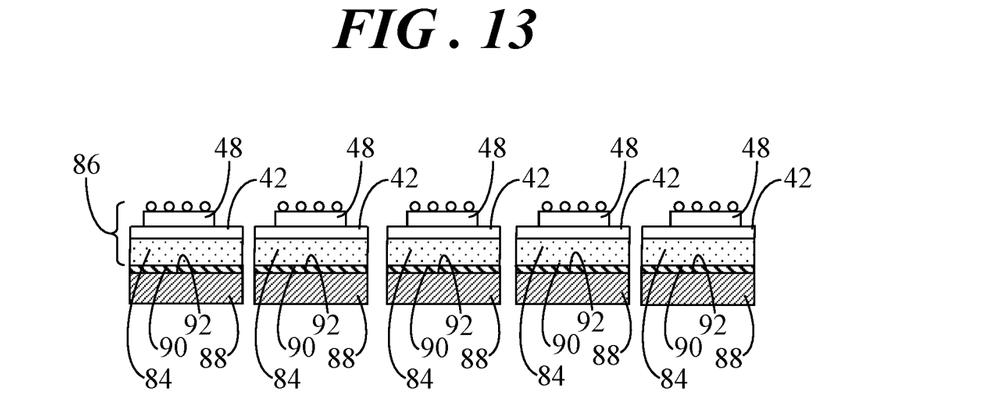
FIG. 13 shows a cross-sectional view of individual semiconductor components formed following dicing of the device wafer of FIG. 12 at a subsequent stage of processing.

FIG. 13 shows a cross-sectional view of individual semiconductor components 86 formed following dicing of device wafer 40 of FIG. 12 at a subsequent stage of processing. Device wafer 40 may be separated at streets 52 (FIG. 12) by dicing, saw cutting, laser cutting, or any other suitable process to form semiconductors components 86 (also referred to as dies or chips) each of which includes active devices 48 on or in substrate 42. In an example, device wafer 40 may have been removed from carrier structure 64 and stripped of back-grinding tape 58. Thereafter, device wafer 40 is separated at streets 52 to produce individual semiconductor components 86, each of which includes bonding layer 84.

In FIG. 13, each of the individual semiconductor components 86 is attached to a secondary structure 88. Secondary structures 88 represent lead frames, heat sinks, metallized areas on printed circuit boards, or any other metal or metallized structure to which semiconductor components 86 are to be attached in accordance with a particular design.

In one example, semiconductor components 86 may be attached to secondary structures 88 using a sintering process. In general, a sintering process entails applying a metal-particle containing material 90 to a mounting surface 92 of each secondary structure 88 and/or to bonding layer 84. Metal-particle containing material 90 may be applied utilizing a dry state application technique, a wet state application technique, or any manner permitting controlled application of metal particle-containing material 90. Metal particle-containing material 90 contains metal particles that are configured to sinter (become a compacted solid mass without melting) during a sintering process. By way of example, metal particle-containing material 90 may contain at least one of silver particles, gold particles, copper particles, and platinum particles, or a mixture thereof.

Thereafter, semiconductor components 86 are arranged in a stacked relationship with corresponding secondary structures 88 such that metal-particle containing material 90 is disposed between them. A low temperature sintering process may be performed at a maximum process temperature that is less than the melting point of the metal particles within metal-particle containing material 90 to transform metal-particle containing material 90 into a sintered bond layer adhering to bonding layer 84 thereby joining semiconductor components 86 and secondary structures 88. The sintering process can be carried-out under any process conditions suitable for transforming metal particle-containing material 90 into a sintered bond layer. The sintering process may be performed with or without pressure, with or without heating (although some degree of elevated heat will typically be applied), and in any suitable atmosphere (preferably open air).

Accordingly, the silicon of silicon substrate 42 bonds with eutectic forming material layer 70 (e.g., gold) to form eutectic alloy composition 74 in order to strengthen outer perimeter 68 of substrate 42. Additionally, bonding layer 84 is utilized for adhesion (e.g., something for metal-particle containing material 90 to bond with) in order to attach semiconductor components 86 to secondary structures 88. In a non-limiting example, a sintering process may be implemented. However, alternative techniques may implement conventional soldering processes, attachment using adhesive epoxy, and so forth.

Figure 14:
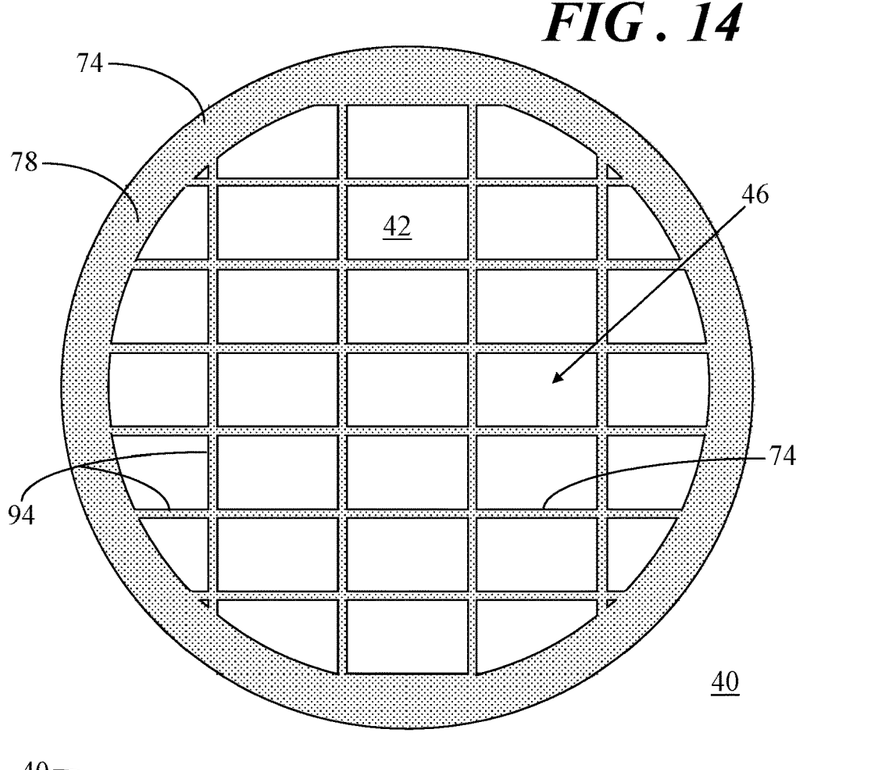
FIG. 14 shows a plan view of a device wafer at an intermediate stage of processing in accordance with another embodiment.
Figure 15:
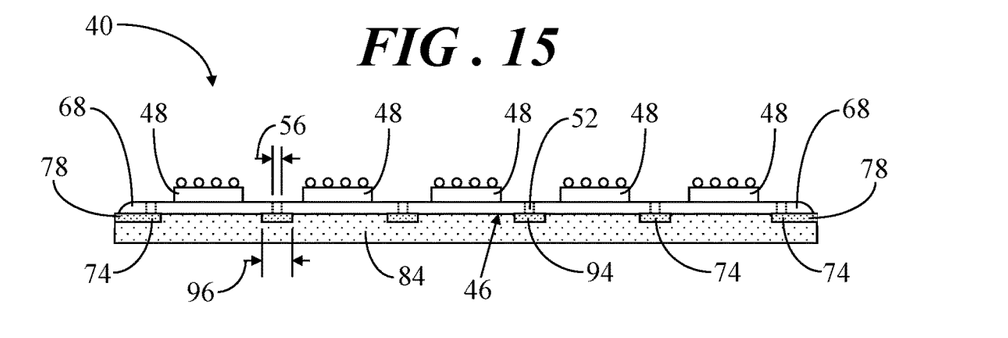
FIG. 15 shows a cross-sectional view of the device wafer of FIG. 14 at a subsequent stage of processing.

Referring to FIGS. 14-15, FIG. 14 shows a plan view of device wafer 40 at an intermediate stage of processing in accordance with another embodiment and FIG. 15 shows a cross-sectional view of device wafer 40 in FIG. 14 at a subsequent stage of processing. As illustrated in FIGS. 14 and 15, device wafer 40 includes portion 78 of eutectic alloy composition 74 (e.g., a silicon-gold eutectic layer) remaining at outer perimeter 68 of substrate 42 following removal of eutectic alloy composition 74 from minor surface 46 of substrate 42.

In accordance with this alternative embodiment, when eutectic alloy composition 74 is removed, an additional portion 94 of eutectic alloy composition 74 remains at streets 52 (best seen in FIG. 15) of substrate 42 of device wafer 40. This additional portion 94 of eutectic alloy composition 74 may have a width 96 in a range of 0-5 microns greater than width 56, in which width 56 represents an amount of material loss (e.g., width of a saw cut) that may occur when device wafer 40 is diced, cut, or otherwise separated at streets 52. Additional portion 94 of eutectic alloy composition 74 remaining at streets 52 is configured to inhibit generation and propagation of cracks at peripheries 54 (FIG. 2) of semiconductor die areas 50 (FIG. 2) when semiconductor die areas 50 are separated at streets 52.

Figure 16:
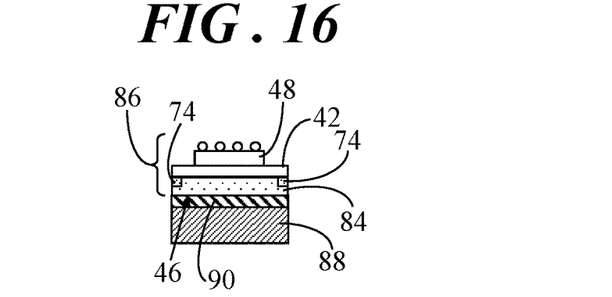
FIG. 16 shows an individual semiconductor component formed following dicing of the device wafer of FIG. 15.

FIG. 16 shows one of semiconductor components 86 formed following dicing of device wafer 40 of FIG. 15 in accordance with the alternative embodiment. In the instance in which width 96 (FIG. 15) of additional portion 94 of eutectic alloy composition 74 is greater than width 56 (FIG. 15), representing an amount of material loss that occurred when device wafer 40 was separated at streets 52, eutectic alloy composition 74 may be present in semiconductor component 86 at minor surface 46 of substrate 42.

Embodiments disclosed herein entail a semiconductor device wafer, semiconductor components, and methodology for manufacturing a device wafer and for attaching semiconductor components of the device wafer to secondary structures. More particularly, methodology entails forming a eutectic alloy composition at the back surface of a thinned device wafer such that a portion of the eutectic alloy composition remains at the outer perimeter of the device wafer. The methodology further entails depositing a bonding layer over the back surface and over the remaining portion of the eutectic alloy composition. In some embodiments, the eutectic alloy composition may be patterned such that an additional portion of the eutectic alloy composition remains at the saw streets of the back surface of the device wafer. Eutectic alloy composition formation and patterning may be integrated into a process flow to inhibit crack generation and propagation at the device wafer edges and along saw streets during device wafer dicing. The bonding layer may be utilized for joining individual semiconductor components of the device wafer to secondary structures. Such an approach may cost effectively reduce wafer breakage due to crack generation and propagation by increasing the strength of the wafer device at strategic locations, while concurrently ensuring a secure bond to the secondary structures.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A method comprising:
providing a device wafer, the device wafer including a substrate having a major surface and a minor surface opposite the major surface, and a plurality of active devices located at the major surface;
forming a eutectic alloy composition at the minor surface of the substrate;
removing the eutectic alloy composition from the minor surface of the substrate such that a portion of the eutectic alloy composition remains at an outer perimeter of the minor surface, wherein the substrate includes a plurality of semiconductor die areas at which the active devices are located and streets around peripheries of the semiconductor die areas, and the removing the eutectic alloy composition from the minor surface of the substrate includes removing the eutectic alloy composition such that an additional portion of the eutectic alloy composition remains at the streets; and
depositing a bonding layer over the minor surface and the portion of the eutectic alloy composition at the outer perimeter of the minor surface; wherein the substrate includes a plurality of semiconductor die areas at which the active devices are located and streets around peripheries of the semiconductor die areas, the plurality of the semiconductor die areas are configured to be separated at the streets to produce individual semiconductor components, and the bonding layer is configured to be utilized for joining the individual semiconductor components to secondary structures.

2. The method of claim 1 wherein the substrate is a silicon substrate having the minor surface, and the forming the eutectic alloy composition comprises:
depositing a eutectic forming material layer on the minor surface of the substrate; and
alloying the eutectic forming material layer into the silicon substrate to form the eutectic alloy composition.

3. The method of claim 2 wherein the eutectic forming material layer is gold and the eutectic alloy composition comprises a silicon-gold eutectic alloy composition.

4. The method of claim 2 wherein the alloying comprises heating the device wafer to a temperature in a range of 330° to 360° C.

5. The method of claim 2 wherein the depositing the eutectic forming material layer includes depositing the eutectic forming material layer to a depth in a range of 2.5-7.5 kilo Angstroms (kA).

6. The method of claim 1 wherein the removing the eutectic alloy composition includes:
forming a mask over the over the eutectic alloy composition, wherein the mask is configured to cover the portion of the eutectic alloy composition at the outer perimeter of the minor surface;
removing an unmasked portion of the eutectic alloy composition from the minor surface of the substrate; and
removing the mask from the portion of the eutectic alloy composition following the removing the unmasked portion of the eutectic alloy composition.

7. The method of claim 1 wherein a width of the portion of the eutectic alloy composition parallel to the minor surface of the substrate at the outer perimeter is approximately 2.5 mm.

8. The method of claim 1 further comprising thinning the substrate at the minor surface prior to forming the eutectic alloy composition at the minor surface, wherein the thinning weakens the outer perimeter of the substrate relative to a remaining portion of the substrate, and the eutectic alloy composition is configured to strengthen the outer perimeter of the substrate to inhibit generation and propagation of cracks in the device wafer.

9. The method of claim 1 wherein the additional portion of the eutectic alloy composition remaining at the streets is configured to have a first width in a range of 0-5 microns greater than a second width of material loss of the device wafer when the semiconductor die areas are separated at the streets.

10. The method of claim 1 wherein the additional portion of the eutectic alloy composition remaining at the streets is configured to inhibit generation and propagation of cracks at the peripheries of the semiconductor die areas when the device wafer is separated at the streets.

11. The method of claim 1 wherein the depositing the bonding layer comprises depositing a solderable backmetal over the minor surface and the portion of the eutectic alloy composition.

12. A method of attaching a semiconductor component to a secondary structure comprising:
providing a device wafer, the device wafer including a substrate having a major surface and a minor surface opposite the major surface, a plurality of semiconductor die areas at the major surface, a plurality of active devices located at the plurality of semiconductor die areas, and streets around peripheries of the semiconductor die areas;
forming a eutectic alloy composition on the minor surface of the substrate;
removing the eutectic alloy composition from the minor surface of the substrate such that a portion of the eutectic alloy composition remains at an outer perimeter of the minor surface, wherein the removing the eutectic alloy composition from the minor surface of the substrate includes removing the eutectic alloy composition such that an additional portion of the eutectic alloy composition remains at the streets;
depositing a bonding layer over the minor surface and the portion of the eutectic alloy composition at the outer perimeter of the minor surface;
separating the plurality of the semiconductor die areas at the streets to produce a plurality of semiconductor components each having the bonding layer, the semiconductor component being one of the plurality of semiconductor components; and
utilizing the bonding layer to attach the semiconductor component to the secondary structure.

13. The method of claim 12 wherein the substrate is a silicon substrate having the minor surface, and the forming the eutectic alloy composition comprises:
depositing a eutectic forming material layer on the minor surface of the substrate; and
alloying the eutectic forming material layer into the silicon substrate to form the eutectic alloy composition.

14. The method of claim 13 wherein the substrate is a silicon substrate having the minor surface, the eutectic forming material layer is gold, the eutectic alloy composition comprises a silicon-gold eutectic alloy composition, and the utilizing the bonding layer comprises:

applying a metal particle-containing material to at least one of a mounting surface of the secondary structure and the bonding layer; and sintering the metal particle-containing material to produce a sintered bond layer bonded with the bonding layer to join the semiconductor component to the secondary structure.

15. The method of claim 12 wherein the additional portion of the eutectic alloy composition remaining at the streets is configured to have a first width in a range of 0-5 microns greater than a second width of material loss of the device wafer when the semiconductor die areas are separated at the streets.

16. A method comprising:

providing a device wafer, the device wafer including a silicon substrate having a major surface and a minor surface opposite the major surface, a plurality of semiconductor die areas at the major surface, a plurality of active devices located at the plurality of semiconductor die areas, and streets around peripheries of the semiconductor die areas;

applying a eutectic forming material layer on the minor surface of the substrate;

alloying the eutectic forming material layer into the silicon substrate to generate a eutectic alloy composition;

removing the eutectic alloy composition from the minor surface of the substrate such that a portion of the eutectic alloy composition remains at an outer perimeter of the minor surface and an additional portion of the eutectic alloy composition remains at the streets; and depositing a bonding layer over the minor surface, over the portion of the eutectic alloy composition at the outer perimeter of the minor surface, and over the additional portion of the eutectic alloy composition remaining at the streets, wherein the method further comprising separating the plurality of the semiconductor die areas at the streets to produce individual semiconductor components, and the bonding layer is configured to be utilized for joining the individual semiconductor components to secondary structures.

* * * * *